(12) United States Patent
Shiu et al.

(10) Patent No.: US 7,056,766 B2
(45) Date of Patent: Jun. 6, 2006

(54) METHOD OF FORMING LAND GRID ARRAY PACKAGED DEVICE

(75) Inventors: Hei Ming Shiu, Hong Kong (HK); Wai Wong Chow, Hong Kong (HK); Nan Xu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 86 days.

(21) Appl. No.: 10/731,831

(22) Filed: Dec. 9, 2003

(65) Prior Publication Data

US 2005/0124147 A1    Jun. 9, 2005

(51) Int. Cl.
H01L 21/44   (2006.01)
H01L 21/48   (2006.01)

(52) U.S. Cl. .................. 438/106; 438/127
(58) Field of Classification Search ............... 438/106, 438/110, 113, 114, 118, 125–127, 612–613
See application file for complete search history.

(56) References Cited

U.S. PATENT DOCUMENTS

| | | | | |
|---|---|---|---|---|
| 5,200,362 A | | 4/1993 | Lin et al. | |
| 5,273,938 A | * | 12/1993 | Lin et al. | 438/107 |
| 5,751,068 A | * | 5/1998 | McMahon et al. | 257/774 |
| 6,000,603 A | * | 12/1999 | Koskenmaki et al. | 228/246 |
| 6,215,179 B1 | * | 4/2001 | Ohgiyama | 257/676 |
| 6,294,100 B1 | * | 9/2001 | Fan et al. | 216/14 |
| 6,429,043 B1 | * | 8/2002 | Nakazawa et al. | 438/106 |
| 6,498,099 B1 | | 12/2002 | McLellan et al. | |
| 6,624,008 B1 | * | 9/2003 | Hasegawa | 438/125 |
| 6,638,790 B1 | | 10/2003 | Minamio et al. | |
| 2001/0041384 A1 | * | 11/2001 | Ohgiyama et al. | 438/111 |
| 2003/0089523 A1 | | 5/2003 | Hoffmeyer | |
| 2003/0090000 A1 | | 5/2003 | Caletka et al. | |

\* cited by examiner

*Primary Examiner*—Evan Pert
(74) *Attorney, Agent, or Firm*—Charles Bergere

(57) ABSTRACT

A method of packaging an integrated circuit die (12) includes the steps of forming an array of soft conductive balls (14) in a fixture (30) and flattening opposing sides of the balls. The flattened balls are then transferred from the fixture to a mold masking tape (36). A first side of the IC die is attached to the balls with a die attach adhesive (16) and then wire bonding pads (20) on the die are electrically connected directly to respective balls with wires (22). An encapsulant (24) is formed over the die, the electrical connections, and a top portion of the formed balls. The tape is removed and adjacent, encapsulated dice are separated via saw singulation. The result is an encapsulated IC having a bottom side with exposed balls.

25 Claims, 5 Drawing Sheets

METHOD OF FORMING LAND GRID ARRAY PACKAGED DEVICE

BACKGROUND OF THE INVENTION

The present invention relates to integrated circuit packaging, and more particularly to an improved process for fabricating a Land Grid Array (LGA) packaged device.

An integrated circuit (IC) die is a small device formed as part of a semiconductor wafer, such as a silicon wafer. A leadframe is a metal frame that usually includes a paddle that supports the IC die that has been cut from the wafer. The leadframe also has lead fingers that provide external electrical connections. That is, the die is attached to the die paddle and then bonding pads of the die are connected to the lead fingers via wire bonding or flip chip bumping to provide the external electrical connections. Encapsulating the die and wire bonds or flip chip bumps with a protective material forms a package. Depending on the package type, the external electrical connections may be used as-is, such as in a Thin Small Outline Package (TSOP), or further processed, such as by attaching spherical solder balls for a Ball Grid Array (BGA). These terminal points allow the die to be electrically connected with other circuits, such as on a printed circuit board. However, it can be expensive and time-consuming to form a leadframe and package a device if steps like chemical etching and etch back are required.

Virtually all electronic devices use packaged ICs and with the ever present demand for smaller yet more powerful devices, a decrease in the package size is highly desirable. LGA packages offer reduced height by eliminating the solder balls that are part of a ball grid array (BGA) package. Instead of attaching the packaged device to a printed circuit board (PCB) with solder balls, LGA packages are attached to the PCB via a socket. More recently, LGA packages have been reflow-mounted using solder that has been applied to the board. The reduced package height without a decrease in reliability is making LGA packages popular for many electronic devices, such as cellular telephones, digital cameras, personal digital assistants (PDA), etc. Further, LGA packages are able to achieve higher pin counts with smaller packages. At the same time, the electrical path from the IC to the package pad is shortened.

Thus, it is desirable to have a method of decreasing the size of packaged ICs. It is also desirable to provide an inexpensive method of packaging ICs.

BRIEF DESCRIPTION OF THE DRAWINGS

The following detailed description of a preferred embodiment of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a method of packaging an integrated circuit die, including the steps of:

forming a plurality of soft conductive forms (e.g., balls) in a fixture, wherein opposing sides of the balls are at least partially flattened;

transferring the formed balls from the fixture to a mold masking tape;

attaching a first side of an integrated circuit die to the mold masking tape, wherein a second side of the die has a plurality of die bonding pads and wherein the die is surrounded by the formed balls;

electrically connecting the die bonding pads to respective ones of the formed balls surrounding the die;

encapsulating the die, the electrical connections, and a top portion of the formed balls with a mold compound; and removing the mold masking tape such that a bottom portion of the balls is exposed. Where more than one device is formed at the same time, then a singulation step is performed to separate adjacent devices.

Figure 1:
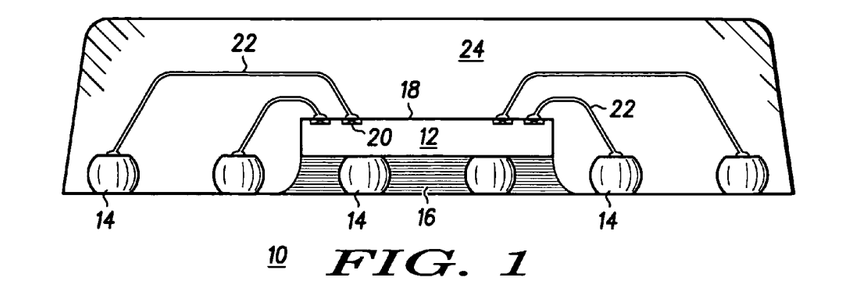
FIG. 1 is an enlarged cross-sectional view of a packaged integrated circuit in accordance with an embodiment of the present invention.

Referring now to FIG. 1, an enlarged cross-sectional view of a packaged semiconductor device 10 formed in accordance with an embodiment of the present invention is shown. The packaged device 10 comprises an integrated circuit die 12, such as one cut from a silicon wafer, attached to one or more soft balls 14 with a die attach material 16. The integrated circuit die 12 has a top or first surface 18 with a plurality of wire bonding pads 20. The wire bonding pads 20 are electrically connected to other ones of the soft balls 14. Preferably, the wire bonding pads 20 are connected to the soft balls 14 with wires 22 via wirebonding. The die 12, the electrical connections, the wires 22, and at least a top portion of the soft balls 14 are covered or encapsulated with a mold compound 24. The bottom sides of the balls 14 are exposed and allow the integrated circuit die 12 to be connected to a printed circuit board. The balls 14 to which wires 22 are connected are used to pass data, power or ground signals to/from the die 12 and a substrate or printed circuit board, as is known by those of skill in the art, while others of the balls 14 to which the die 12 is attached can conduct heat from the die 12 (i.e., thermal management) and enhance board level solder joint strength. That is, the balls 14 under the die 12 provide a solderable surface that enhances board level solder strength. It is noted that balls at the corners and even along the package edges also can provide connections that enhance the mechanical strength of the package.

The integrated circuit die 12 may be any type of circuit, such as a digital signal processor, a special purpose circuit, etc. Such circuits are well known to those of skill in the art. The soft balls 14 preferably are made with an electrically conductive material so that electrical signals can be passed therethrough. The conductive material may be a metal, such as copper or gold, or an alloy thereof, or a soft solder, such as 63/37 material (63% tin, 37% lead) or 90/10 (90% lead, 10% tin). Alternatively, the soft balls 14 may be formed of a polymer base material with metallic surface finish. A lead free package can be achieved by using lead free metallic balls. The balls 14 are made of a soft material so that the wires 22 can be readily wirebonded thereto. Preferably, the wires 22 are made of a stiffer or more rigid material, such as copper or a hard gold alloy so that during wirebonding, the wires 22 penetrate into and are embedded within the soft balls 14. As will be discussed in more detail below, using a harder material for the wires 22 allows the wires 22 to penetrate into the soft balls 14, hence forming a connection by embedding the hard wires 22 into the softer balls 14.

The die 12 is attached to a plurality of the balls 14 with the die attach material 16. The die attach material 16 may be any well known adhesive used for attaching dice to substrates, such as an epoxy. Although in the embodiment shown the die 12 is attached to the balls 14, the die 12 may be attached to one side of a die paddle formed of a metal, such as copper, in which case the other side of the die paddle is exposed. Another alternative is to have the bottom (or second side) of the die 12 exposed, in which case the die 12 is not attached to any of the balls 14 or to a die paddle. The encapsulant 24 is of a type known to those of skill in the art that is commonly used for packaging integrated circuits.

Figure 2A:
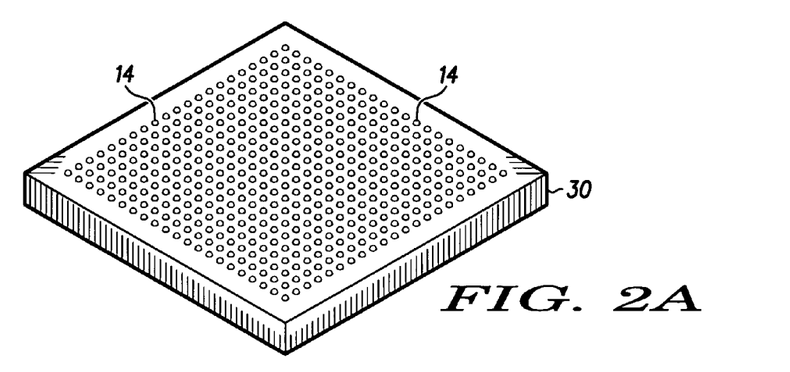
FIG. 2A is a perspective view of a fixture for forming conductive balls in accordance with an embodiment of the present invention.
Figure 2B:
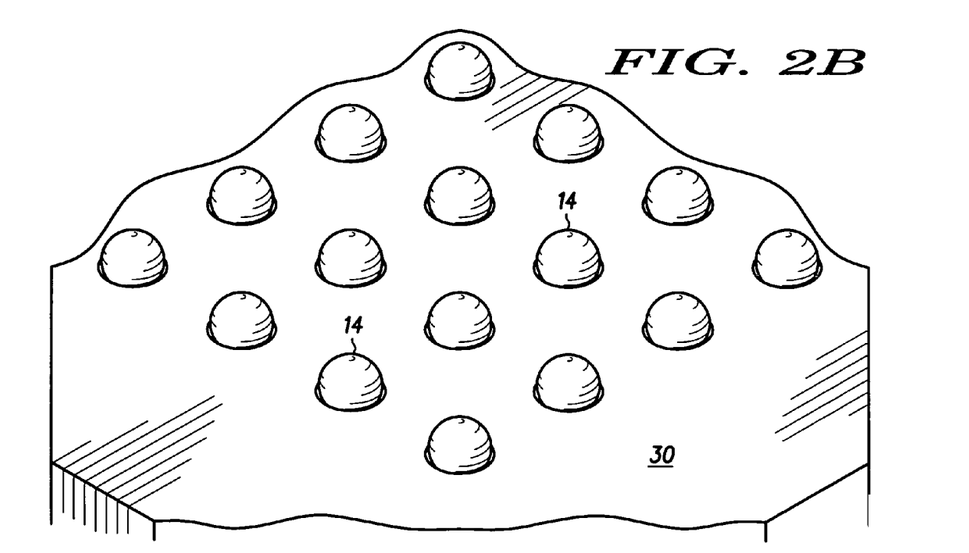
FIG. 2B is a greatly enlarged view of conductive balls located in the fixture of FIG. 2A.

Referring now to FIGS. 2A–9, a method for packaging an IC die in accordance with the present invention will be described. FIGS. 2A and 2B show a fixture 30 for forming the sot t conductive balls 14 in accordance with an embodiment of the present invention. FIG. 2A is a perspective view of the fixture 30 and FIG. 2B is an enlarged view of the conductive balls located in the fixture 30. An initial step in the process of packaging an integrated circuit die 12 is for forming the soft balls 14. The fixture 30 is a block of metal having a large flat surface with a plurality of cavities in which the balls 14 are formed. The cavities are laid out in a grid or array on the surface of the fixture 30. Low manufacturing cost is one of the key considerations for the present invention. In the presently preferred embodiment, the balls 14 are formed by pouring molten metal on a spinning plate. This allows tiny metallic balls to be formed with very tight dimension control in a very cost effective way. The cavities in the fixture 30 are generally round. Preferably, the cavity has a flat or partially flattened bottom surface so that the portion of the ball formed within the cavity has a flattened or partially flattened surface. As an alternative to forming spherical balls or spherical balls with a flattened bottom surface, it is possible to use rectangular shaped forms. FIG. 10 shows an example of a rectangular form 15.

Figure 3A:
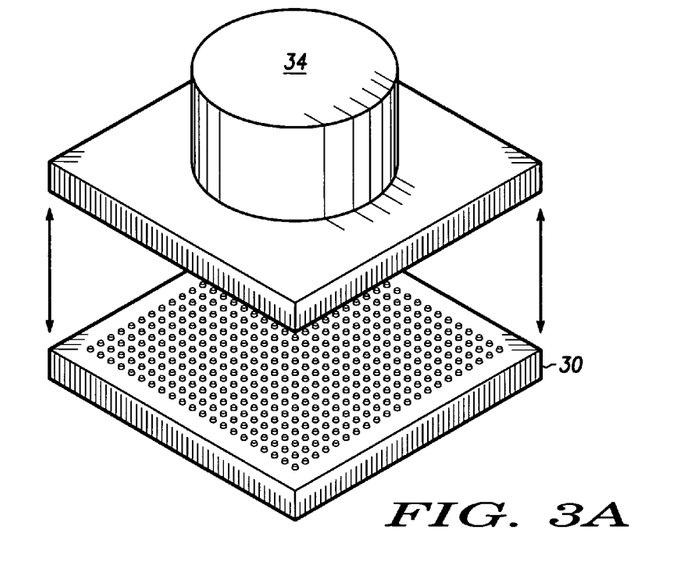
FIG. 3A is a perspective view illustrating a mechanical coining process on the conductive balls in the fixture of FIG. 2A.
Figure 3B:
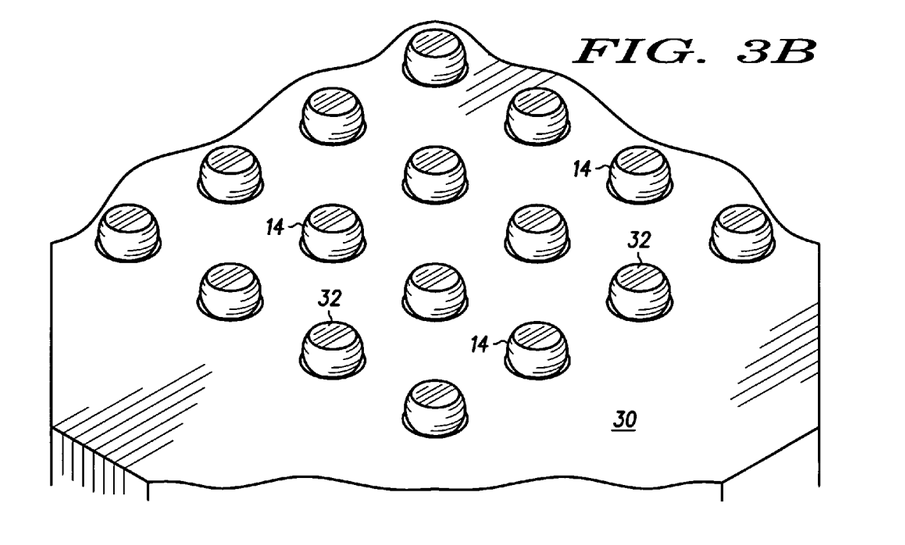
FIG. 3B is a greatly enlarged perspective view of the conductive balls in the fixture of FIG. 2A after the mechanical coining process.

As previously discussed, the balls 14 are formed of a soft, conductive material that can be deformed, such as a soft metal. Example metals are solder or gold. As is known by those of skill in the art, most BGA balls are made out of 63/37 material (63% tin, 37% lead), which is very soft. Even when 90/10 (90% lead, 10% tin) material is used, the ball shape can deform. Referring now to FIGS. 3A and 3B, after the balls 14 are located in the fixture 30, top surfaces 32 of the balls 14 are flattened by a press 34 via a mechanical coining process. That is, the press 34 is used to push against the top surfaces of the balls 14 within the cavities of the fixture 30, which flattens the top surfaces 32 of the balls 14. As the cavities preferably have a flat or partially flat bottom surface, the bottom surfaces of the balls 14 are flattened in the same way as the top surfaces 32. Thus, at least two opposing sides of the balls 14 are flattened or partially flattened.

Figure 4:
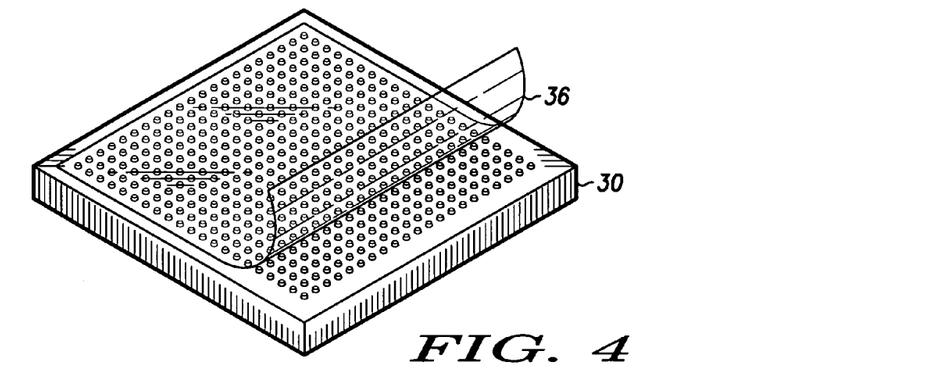
FIG. 4 is a perspective view illustrating a step of transferring the conductive balls from the fixture of FIG. 2A to an adhesive tape.
Figure 5A:
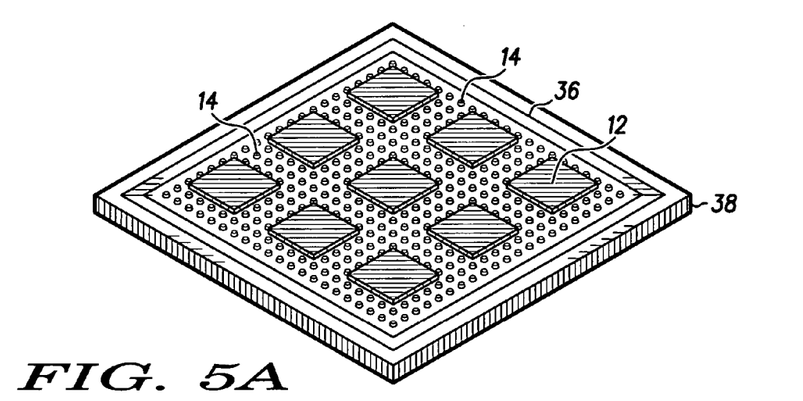
FIG. 5A is a perspective view of a die attach process in accordance with an embodiment of the present invention.

Referring now to FIG. 4, after the mechanical coining process, the balls 14 are transferred from the fixture 30 to a mold masking tape 36 that has an adhesive on one side thereof. More particularly, the tape 36 is placed over the balls 14. The balls 14 stick to the adhesive surface of the tape 36 and then the tape 36 is lifted away from the fixture 30. Alternatively, the fixture 30 is placed against the tape 36 and after the balls 14 stick to the adhesive surface of the tape 36, the fixture 30 is moved. The mold masking tape 36 may be attached to a metal frame 38, either before or after the balls 14 are transferred to the tape 36, as shown in FIG. 5.

After the balls 14 are transferred to the mold masking tape 36, a die attaching step is performed. Referring to FIG. 5A, the integrated circuit dice 12 are attached to a plurality of the balls 14 at predetermined locations. The dice 12 have a top surface including a plurality of wire bonding pads 20 and a bottom surface. In the presently preferred embodiment, the bottom surfaces of the dice 12 are attached directly to the balls 14 with a die attach adhesive 16 (FIG. 1). The dice 12 are attached at locations such that the dice 12 are surrounded by a plurality of the balls 14. The number of I/O's is used to determine the number of balls 14 that surround each of the die 12. Attaching the die 12 on top of a plurality of the balls 14, allows a fixture to be used to form the balls that is uniform in size and has a single ball matrix pattern. A single ball matrix pattern allows different size die and different package sizes to be formed without having to change the size of the fixture 30. Further, as discussed above, the balls 14 upon which the die 12 is attached serve as a thermal path for the IC 12 and provide a solderable surface that enhances board level solder joint strength. That is, the balls 14 provide a solderable surface.

Figure 5B:
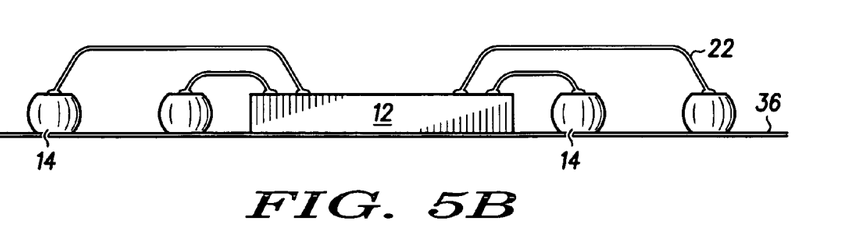
FIGS. 5B–5D are enlarged cross-sectional views illustrating alternative die attach processes.
Figure 5C:
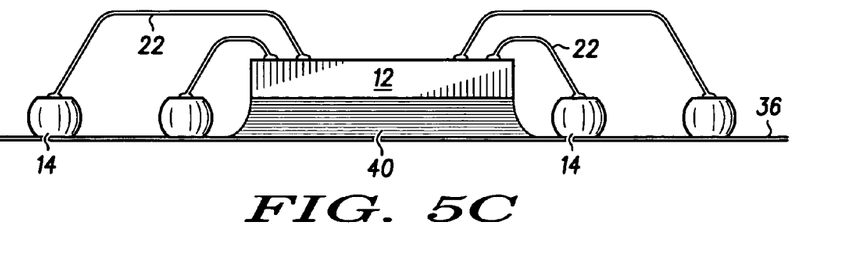
Figure 5D:
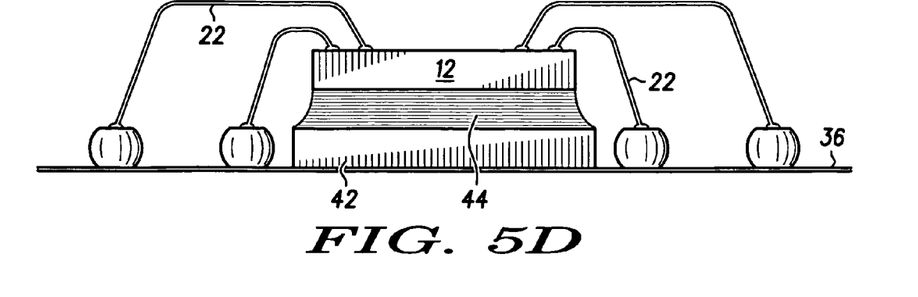

Other options for die attach exist. One option is to attach the dice 12 directly to the tape 36 at locations where there are no balls 14, as shown in FIG. 5B. That is, when forming the array of balls in the fixture 30, some spots are left without balls, such spots for receiving individual die 12. In this way, the die 12 has an exposed surface after encapsulation and de-taping. A second option is to attach the dice 12 to the tape 36 with a nonconductive epoxy 40, as shown in FIG. 5C. In a package formed using this second option, the die 12 is not exposed nor is there a conductive path between the die 12 and the outside of the finished package. This second option allows PCB routing under the package. Referring to FIG. 5D, yet another option is to attach the die 12 to a beat sink 42 (e.g., a solid metal plate) with an epoxy or solder 44. The heat sink 42 can be attached to the tape 36 after the balls 14 are attached to the tape 36. The heat sink 42 can further improve the thermal performance of the package and increase the solderable area of the package.

Figure 6A:
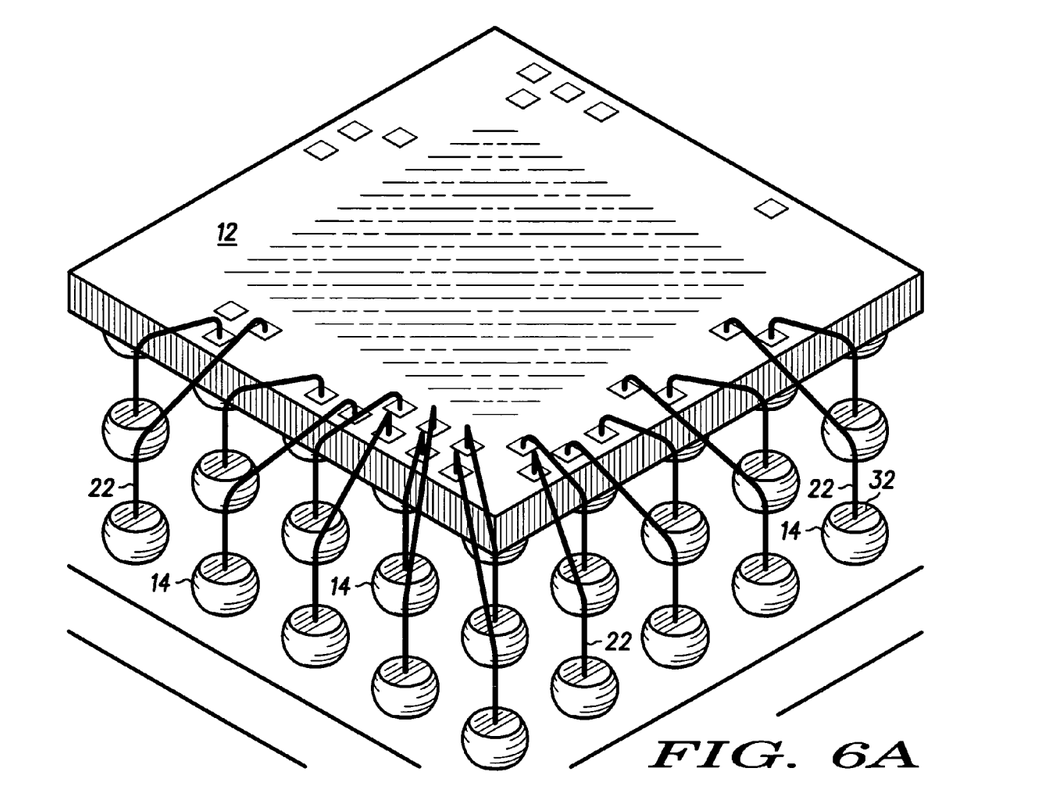
FIG. 6A is a greatly enlarged perspective view illustrating one of the die of FIG. 5 wirebonded to a plurality of the conductive balls.
Figure 6B:
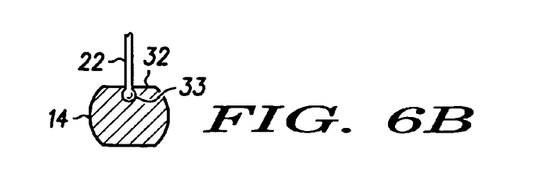
FIG. 6B is a greatly enlarged cross-sectional view of one of the wire-bonds of FIG. 6A.

Referring now to FIGS. 1, 6A and 6B, after the die 12 has been attached to the tape 36 or the balls 14, as described above, the wire bonding pads 20 are electrically connected to respective ones of the formed balls 14 surrounding the die 12. More particularly, bonding wires 22 are connected from the IC wire bonding pads 20 to respective ones of the formed balls 14. As the formed balls 14 are held only by the adhesive of the mold masking tape 36, the balls may not be held rigid enough to apply the ultrasonic force used in the traditional thermosonic wire bonding process. Thus, instead of applying the traditional thermosonic bonding, hard wire made of copper or a hard gold alloy is used to penetrate into the soft balls 14, which forms a connection by embedding the hard wire 22 into the soft ball 14. As shown in FIG. 6B, a tip 33 of the wire 22 is embedded within the ball 14. The tip 33 is generally circular in shape and is formed by electric flame off (EFO) of the wire 22 by wire bonding machine.

Figure 7:
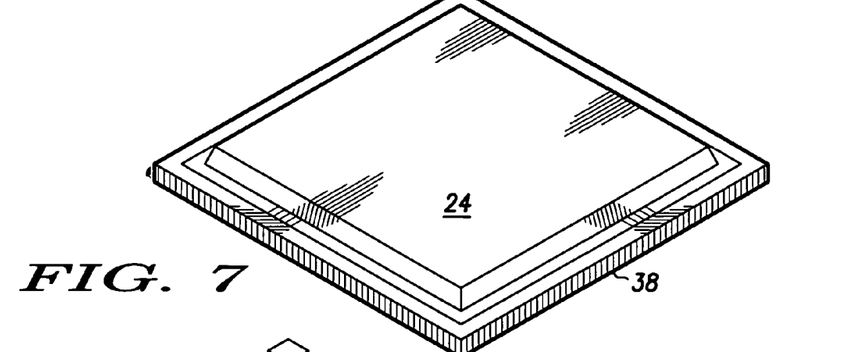
FIG. 7 is a perspective view of a top side of the adhesive tape having dice wire-bonded to the conductive balls after an encapsulation process.

After the wirebonding process is performed, the die 12, the electrical connections, the wires 22 and a portion of the balls are encapsulated, preferably with a plastic material, as is known in the art for packaging integrated circuits. FIG. 7 shows the metal frame 38 that holds the tape 36 having the encapsulant 24 thereon. At this stage, the encapsulant covers the whole of one side of the tape 36. It is noted that the partially flattened sides of the balls 14 provide a locking feature that helps to secure that balls 14 within the encapsulant 24.

Figure 8:
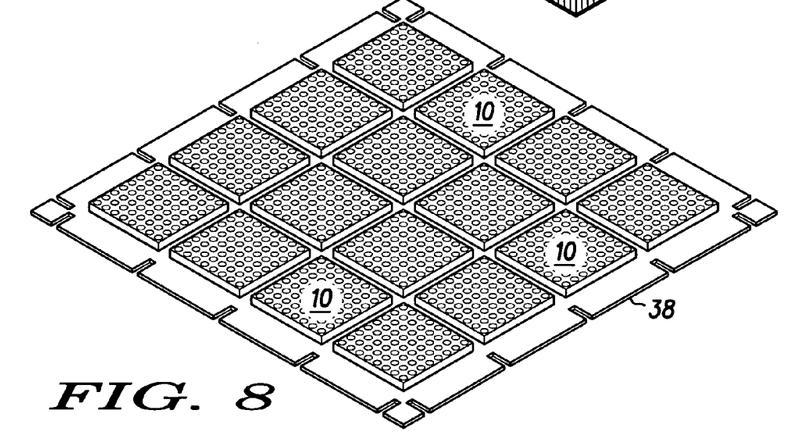
FIG. 8 is a perspective view showing a bottom side of the encapsulated devices after a de-taping step in accordance with an embodiment of the present invention.
Figures 9, 10:
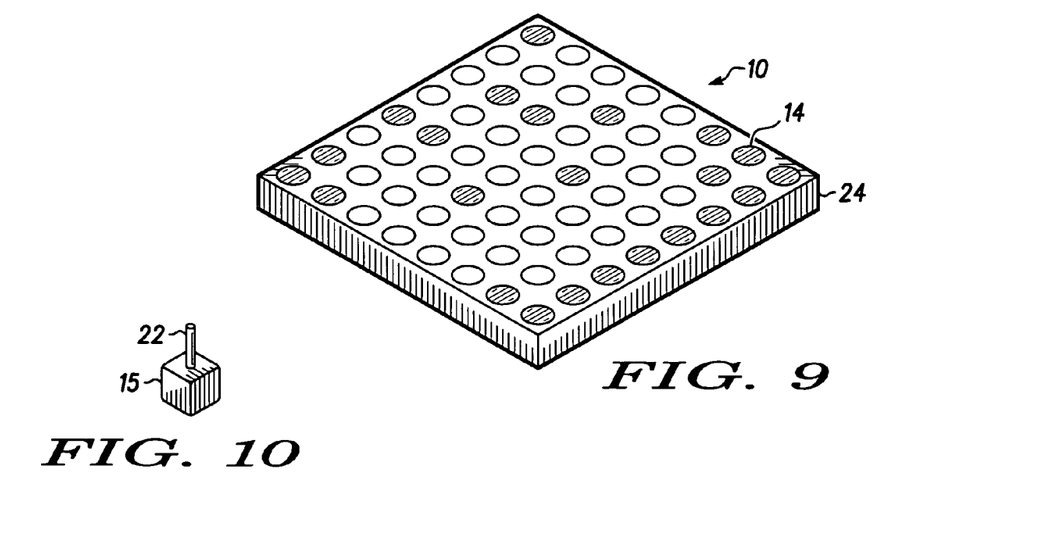
FIG. 9 is a perspective view of a bottom of a packaged device after a singulation process in accordance with the present invention.
FIG. 10 is a perspective view of an alternate embodiment of a conductive ball in accordance with the present invention.

After the encapsulation process, the mold masking tape 36 is removed, such as by hand or with a commercially available de-peeling machine, thereby uncovering the bottom portions of the array of balls 14, as shown in FIG. 8. To ensure reliable LGA interconnection performance, the exposed bottom portions of the balls may be coated or plated with a noble surface finish (e.g., NI/Au) that is both resistant to corrosion and provides low contact resistance. The exposed portions of the balls 14 may be coated via selective deposition of electrolytic Ni/Au platings. Finally, the encapsulated matrix is singulated, preferably using a well-known saw singulation process, to form separate packaged devices 10.

Prior to the saw singulation process, an optional electrical functional test may be performed. Since all of the I/O terminals of the encapsulated devices are separated throughout the packaging process, an electrical test in strip format is possible, hence improving tester utilization and making parallel testing possible without additional process or cost.

The packaged device has improved high-frequency electrical performance because the signal path from the IC 12 to the board is shortened. Further, system reliability is improved by increasing solder joint resistance to stress failures caused by deflections of the system board. Improved RF performance and resistance to mechanical stress failures are important issues to cellular telephone handset makers.

The present invention provides an easy and inexpensive method of packaging an integrated circuit. Device cost is low because neither a substrate nor terminations (external pins or balls) are required. Since there is no metal leadframe, the saw blade used in the singulation step does not have to cut through metal, so the saw blade will have a longer life. Also, since no leadframe is required, there is no need to perform substrate trace routing. The packaging process does not require any chemical etch-back, which can be expensive. The packaging process may be performed using currently available equipment. The package also has a very low profile, down to 0.4 mm. Although a LGA package is described, other package types, such as QFN (Quad Flat No lead) also can be formed using the aforedescribed method. Stacked die devices can also be packaged with this method. Land grid arrays (LGA) offer high interconnection density, e.g., 200+ I/Os is possible.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method of packaging an integrated circuit die, comprising the steps of:
    forming a plurality of soft conductive forms in a fixture, wherein opposing sides of the forms are at least partially flattened;
    transferring the formed forms from the fixture to a mold masking tape;
    attaching a first side of an integrated circuit die to the mold masking tape, wherein a second side of the die has a plurality of die bonding pads and wherein the die is surrounded by the formed forms;
    electrically connecting the die bonding pads to respective ones of the formed forms surrounding the die;
    encapsulating the die, the electrical connections, and a top portion of the formed forms with a mold compound; and
    removing the mold masking tape such that a bottom portions of the forms are exposed.

2. The method of packaging an integrated circuit die of claim 1, wherein the forms formed in the fixture are spherical.

3. The method of packaging an integrated circuit die of claim 1, wherein the forms formed in the fixture are generally rectangular.

4. The method of packaging an integrated circuit die of claim 1, wherein the forms undergo a mechanical coining step wherein at least two opposing sides of the forms are at least partially flattened.

5. The method of packaging an integrated circuit die of claim 1, wherein an array of forms is formed in the fixture.

6. The method of packaging an integrated circuit die of claim 1, further comprising attaching the mold masking tape to a frame.

7. The method of packaging an integrated circuit die of claim 1, wherein the die attaching step comprises attaching the first side of the die to a plurality of the forms with a die attach adhesive.

8. The method of packaging an integrated circuit die of claim 1, wherein the electrically connecting step comprises wirebonding the die bonding pads to the respective ones of the forms with a corresponding plurality of wires.

9. The method of packaging an integrated circuit die of claim 8, wherein in the wirebonding step, the wires penetrate into the forms and are embedded therein.

10. The method of packaging an integrated circuit die of claim 9, wherein the wires are formed of copper, gold, or an alloy thereof.

11. The method of packaging an integrated circuit die of claim 10, wherein the forms are formed of a metal that is softer than the wires so that the wires can be embedded into the forms.

12. The method of packaging an integrated circuit die of claim 11, wherein the metal comprises solder or gold.

13. The method of packaging an integrated circuit die of claim 1, further comprising the step of saw singulating the encapsulated die from adjacent encapsulated dice.

14. A method of packaging a plurality of integrated circuit dice, comprising the steps of:
   forming a plurality of soft conductive forms in a fixture, wherein opposing sides of the forms are at least partially flattened;
   transferring the formed forms from the fixture to a mold masking tape;
   attaching first sides of the plurality of integrated circuit dice to the mold masking tape, wherein a second side of the dice have a plurality of die bonding pads and wherein each of the die is surrounded by some of the formed forms;
   electrically connecting the die bonding pads of the dice to respective ones of the formed forms surrounding the dice;
   encapsulating the dice, the electrical connections, and a top portion of the formed forms with a mold compound;
   removing the mold masking tape such that a bottom portions of the forms are exposed; and
   singulating the encapsulated dice to form individual packaged devices.

15. The method of packaging an integrated circuit die of claim 14, wherein the forms formed in the fixture are spherical.

16. The method of packaging an integrated circuit die of claim 14, wherein the forms formed in the fixture are generally rectangular.

17. The method of packaging an integrated circuit die of claim 14, wherein the forms undergo a mechanical coining step wherein at least two opposing sides of the balls are at least partially flattened.

18. The method of packaging an integrated circuit die of claim 14, wherein an array of forms is formed in the fixture.

19. The method of packaging an integrated circuit die of claim 14, further comprising the step of attaching the mold masking tape to a frame.

20. The method of packaging an integrated circuit die of claim 14, wherein the dice attaching step comprises attaching the first side of the dice to a plurality of the forms with a die attach adhesive.

21. The method of packaging an integrated circuit die of claim 14, wherein the electrically connecting step comprises wirebonding the die bonding pads to the respective ones of the forms with a corresponding plurality of wires.

22. The method of packaging an integrated circuit die of claim 21, wherein in the wirebonding step, the wires penetrate the forms and are embedded therein.

23. The method of packaging an integrated circuit die of claim 22, wherein the wires are formed of copper, gold, or an alloy.

24. The method of packaging an integrated circuit die of claim 23, wherein the forms are formed of a metal that is softer than the wires so that the wires can be embedded into the forms.

25. The method of packaging an integrated circuit die of claim 24, wherein the metal comprises solder or gold.

* * * * *

UNITED STATES PATENT AND TRADEMARK OFFICE
CERTIFICATE OF CORRECTION

| | | |
|---|---|---|
| PATENT NO. | : 7,056,766 B2 | Page 1 of 1 |
| APPLICATION NO. | : 10/731831 | |
| DATED | : December 9, 2003 | |
| INVENTOR(S) | : Hei Ming Shiu | |

It is certified that error appears in the above-identified patent and that said Letters Patent is hereby corrected as shown below:

In Column 7, Line 11, Claim No. 14:
    Change "dice, comprising" to --die, comprising--
In Column 7, Line 18, Claim No. 14:
    Change "dice to the mold" to --die to the mold--
In Column 7, Line 19, Claim No. 14:
    Change "of the dice have" to --of the die have--
In Column 7, Line 22, Claim No. 14:
    Change "of the dice to" to --of the die to--
In Column 7, Line 24, Claim No. 14:
    Change "dice;" to --die;--
In Column 7, Line 25, Claim No. 14:
    Change "encapsulating the dice," to --encapsulating the die,--
In Column 7, Line 28, Claim No. 14:
    Change "such that a bottom" to --such that bottom--
In Column 7, Line 30, Claim No. 14:
    Change "encapsulated dice to" to --encapsulated die to--
In Column 8, Line 14, Claim No. 20:
    Change "wherein the dice" to --wherein the die--
In Column 8, Line 15, Claim No. 20:
    Change "side of the dice" to --side of the die--

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO.         : 7,056,766 B2                                    Page 1 of 1
APPLICATION NO. : 10/731831
DATED              : June 6, 2006
INVENTOR(S)        : Hei Ming Shiu It is certified that error appears in the above-identified patent and that said Letters Patent is hereby corrected as shown below:

In Column 7, Line 11, Claim No. 14:
    Change "dice, comprising" to --die, comprising--
In Column 7, Line 18, Claim No. 14:
    Change "dice to the mold" to --die to the mold--
In Column 7, Line 19, Claim No. 14:
    Change "of the dice have" to --of the die have--
In Column 7, Line 22, Claim No. 14:
    Change "of the dice to" to --of the die to--
In Column 7, Line 24, Claim No. 14:
    Change "dice;" to --die;--
In Column 7, Line 25, Claim No. 14:
    Change "encapsulating the dice," to --encapsulating the die,--
In Column 7, Line 28, Claim No. 14:
    Change "such that a bottom" to --such that bottom--
In Column 7, Line 30, Claim No. 14:
    Change "encapsulated dice to" to --encapsulated die to--
In Column 8, Line 14, Claim No. 20:
    Change "wherein the dice" to --wherein the die--
In Column 8, Line 15, Claim No. 20:
    Change "side of the dice" to --side of the die--

This certificate supersedes the Certificate of Correction issued May 20, 2008.

Signed and Sealed this

Seventeenth Day of June, 2008

JON W. DUDAS
*Director of the United States Patent and Trademark Office*